(12) United States Patent
Grosse et al.

(10) Patent No.: US 7,159,536 B1
(45) Date of Patent: Jan. 9, 2007

(54) DEVICE AND METHOD FOR GENERATING A LOCAL BY MICRO-STRUCTURE ELECTRODE DIS-CHARGES WITH MICROWAVES

(75) Inventors: Stefan Grosse, Gerlingen (DE); Johannes Voigt, Leonberg (DE)

(73) Assignee: Robert Bosch GmbH, Stuttgart (DE)

( * ) Notice: Subject to any disclaimer, the term of this patent is extended or adjusted under 35 U.S.C. 154(b) by 277 days.

(21) Appl. No.: 09/831,722

(22) PCT Filed: Aug. 23, 2000

(86) PCT No.: PCT/DE00/02877

§ 371 (c)(1),
(2), (4) Date: Sep. 6, 2001

(87) PCT Pub. No.: WO01/20640

PCT Pub. Date: Mar. 22, 2001

(30) Foreign Application Priority Data

Sep. 14, 1999 (DE) ................ 199 43 953

(51) Int. Cl.
*C23C 16/511* (2006.01)
(52) U.S. Cl. .............. 118/723 MW; 156/345.36; 313/567; 313/231.31; 216/69
(58) Field of Classification Search ........... 427/575; 118/723 MW; 156/345.36; 313/567, 231.31; 216/69
See application file for complete search history.

(56) References Cited

U.S. PATENT DOCUMENTS

| | | | | |
|---|---|---|---|---|
| 4,890,294 A | * | 12/1989 | Nishimae et al. | 372/57 |
| 6,224,836 B1 | * | 5/2001 | Moisan et al. | 422/186 |
| 6,246,301 B1 | * | 6/2001 | Sogo et al. | 333/185 |

FOREIGN PATENT DOCUMENTS

| | | |
|---|---|---|
| DE | 4136297 | 5/1993 |
| DE | 19503205 | 7/1996 |
| JP | 7122495 | 5/1995 |

OTHER PUBLICATIONS

Frame et al., "Microdischarge Devices Fabricated in Silicon", Applied Physics Letters, US, American Institute of Physics, New York, vol. 71, No. 9, Sep. 1, 1997, pp. 1165-1167.
Ghanasev et al., "Surface Wave Eigenmodes in a Finite-Area Plane Microwave Plasma", Japanese Journal of Applied Physics, JP, Publication Office Japanese Journal of Applied Physics, Tokyo, vol. 36, Part 1, No. 1A, 1997, pp. 337-344.
Patent Abstracts of Japan, vol. 1999, No. 05, May 31, 1999 & JP 11 045876 (Hitachi Ltd.), Feb. 16, 1999.

OTHER PUBLICATIONS

M. Roth et al., "Micro-Structure Electrodes as Electronic Interface Between Solid and Gas Phase: Electrically Steerable Catalysts for Chemical Reaction in the Gas Phase", 1997, 1st Int. Conf. on Microreaction Technology, Frankfurt/Main.
Kummer, "Grundlagen der Mikrowellentechnik" (Fundamentals of Microwave Technology), VEB Publishers-Technology, Berlin, 1986.

* cited by examiner

*Primary Examiner*—Bret Chen
(74) *Attorney, Agent, or Firm*—Kenyon & Kenyon LLP

(57) ABSTRACT

Device for producing a plasma, in particular for treating surfaces, for chemically reacting gases, or for producing light, by way of microstructure electrode discharges, using a device for producing plasma having at least one guide structure. A microwave generator which can be used to launch microwaves into the guide structure. The guide structure has a locally narrowly limited plasma region in contact with a gas. The guide structure is preferably a metallic waveguide filled with a dielectric material, or an arrangement of strip lines which run on a dielectric plate. The device and the method are particularly suited for processing or activating surfaces or for depositing layers on a substrate.

7 Claims, 1 Drawing Sheet

DEVICE AND METHOD FOR GENERATING A LOCAL BY MICRO-STRUCTURE ELECTRODE DIS-CHARGES WITH MICROWAVES

FIELD OF THE INVENTION

The present invention relates to a device and a method for producing a plasma, in particular for treating surfaces, for chemically reacting gases, or for producing light, by making use of microstructure electrode discharges.

BACKGROUND INFORMATION

When treating surfaces using a plasma method, it is advantageous for the plasma to be produced as closely as possible to the surface or substrate to be treated, or for a plasma source having a sharply defined or local plasma volume to be introduced in close proximity to the substrate to be treated. This may be achieved by using so-called microstructure electrode discharges, provision being made for dielectric plates having electrodes that are typically disposed at a distance of approximately 100 µm or less from one another. As is generally known, discharges of this kind work within a very broad pressure range and exhibit relatively sharply delimited plasma interfaces, i.e., large-area, but locally narrowly limited, small-volume plasmas are produced.

Microstructure electrode discharges have been ignited and operated by d.c. voltage. In this regard, reference is made, for example, to M. Roth et al., "Micro-Structure Electrodes as Electronic Interface Between Solid and Gas Phase: Electrically Steerable Catalysts for Chemical Reaction in the Gas Phase", 1997, 1st Int. Conf. on Microreaction Technology, Frankfurt/Main and J. W. Frame, "Microdischarge Devices Fabricated in Silicon", 1997, Appl. Phys. Lett., 71, 9, 1165. High-frequency or microwave excitations have not been implemented under known methods heretofore.

It is also known from Kummer, "Grundlagender Mikrowellentechnik" (Fundamentals of Microwave Technology), VEB Publishers-Technology, Berlin, 1986, to direct microwaves via waveguides or strip waveguides (microstrip technology). In the case of the strip waveguides (microstrips), a metallic printed conductor, into which microwaves are launched, is usually applied to a dielectric substrate having a multiply grounded metallic base plate. In the case that there is more than one printed conductor running on the base plate, the metallic base plate can be eliminated.

SUMMARY OF THE INVENTION

It is believed that the device in accordance with the present invention and its associated method have the advantage over the related art of eliminating the need for the produced plasma to come into direct contact with the device producing the plasma, and, in particular, with the parts of this device being used as electrodes. This may substantially prolong the service life of the entire device in accordance with the present invention and, in particular, of the guide structure being used as microstructure electrodes. Moreover, the device in accordance with the present invention may be easier to service.

Moreover, due to the slight penetration depth of currents at high frequencies, the electrode material (i.e., the guide structure (metallic waveguide or strip waveguide) for guiding the launched microwaves in the device producing the plasma) can be kept very thin, which should simplify fabrication. Thus, at a frequency of 2.45 GHz, depending on the material used, the requisite thickness may be merely a few µm. This applies as well for structures or components used for launching the microwaves into the guide structure. In particular, the guide structure can be advantageously vapor-deposited, as well.

A locally or spatially narrowly bounded plasma is produced by microwaves in one or preferably in a multiplicity of plasma regions that are isolated from one another, by a supplied gas, which is directed past or through the guide structure, or which acts upon the guide structure. Thus, a gas plasma is produced at the surface of the guide structure, at least on a region by region basis, in the plasma regions and in a plasma volume defined by these regions.

Thus, it is quite beneficial for the service life of the device (i.e., of the guide structure functioning as microstructure electrodes) for it to be coated with a protective dielectric layer in the vicinity of the plasma regions. Primarily suited for this are ceramic protective layers. The service life of the microstructure electrodes may be significantly prolonged by this protective layer which cannot be used in a direct voltage operation.

Moreover, to fabricate the device, one can revert to existing technologies for generating plasma and, in particular, for guiding and discharging the launched microwaves in the guide structure. Thus, the microwaves are guided very advantageously via a known waveguide hollow conductor arrangement or a known micro-strip arrangement, which is produced and structurally configured using likewise generally known microstructuring methods.

The microwaves generated by a microwave generator are advantageously launched into the guide structure via at least one launching structure which communicates electroconductively with the guide structure. The frequency of the supplied microwaves amounts advantageously to 300 MHz to 300 GHz.

As part of the device for generating the gas discharge and, respectively, the plasma, the guide structure for the injected microwaves is in an exemplary embodiment a metallic waveguide, which is filled with a puncture-proof, rigid dielectric material, such as silicon dioxide. However, in an alternative exemplary embodiment, the guide structure can be constructed of an arrangement of at least two, preferably parallel spaced metal plates, whose interstitial space is filled in with a dielectric material. Due to its simpler structural design, as compared to closed waveguides, this configuration may offer advantages from a standpoint of production engineering.

The waveguides, the metal layers of the waveguides, or the metal plates, advantageously have a thickness, respectively a spacing, that corresponds to the penetration depth of the injected microwaves. Typical values, known, for example from Kummer, "Grundlagender Mikrowellentechnik" Fundamentals of Microwave Technology), VEB Technical Publishers, Berlin, 1986, are within the µm range, given a typical expansion in the length and/or width of the waveguides, i.e., of the metal plates, in the cm range.

A particular benefit is derived when the $H_{10}$ mode of the launched microwaves is excited and guided in the waveguide, as a guide structure, since, in this case, it is merely the width of the waveguide that is critical for the propagation of the microwaves, and its length, for example, apart from unavoidable attenuation, can be varied substantially freely.

Alternatively, the guide structure can advantageously also be an arrangement made up of at least two metallic, in particular parallel conductive strips, which run on a dielectric plate. Here, as well, silicon dioxide is suited, for example, as material for the plate. These conductive strip lines are fabricated with a thickness of a few penetration depths, preferably using known microstructuring methods or microstrip structuring techniques.

In addition, provision is made in the vicinity of the guide structure for at least one, but preferably for a multiplicity of, plasma regions, which are advantageously produced by a microstructuring of the guide structure.

It is quite beneficial for these plasma regions to be cylindrical holes in the guide structure. Typical cylindrical hole diameters are advantageously about 50 µm to 1000 µm. They are expediently distributed in a regular arrangement in the vicinity of the guide structure. In the case of a waveguide as a guide structure, these cylindrical holes have the considerable advantage, in combination with the excited $H_{10}$ mode, that the generated electrical field is aligned within the waveguide in parallel to the cylindrical holes and is substantially homogeneous. As a result, variations in field strength in the direction of the waveguide width are minimal in comparison to higher excitable modes.

To avoid or minimize surface stress or material ablation and accompanying gradual destruction of the plasma regions (i.e., of the guide structure) by the generated plasma, the inner wall of the cylindrical holes and, optionally, the entire electrode surfaces as well, are advantageously provided with a dielectric, in particular a ceramic protective layer. This dielectric protective layer only marginally degrades the propagation of the microwaves in the guide structure.

The plasma is advantageously produced in the plasma-generation regions at a pressure of 0.01 mbar to 1 bar, a microwave power of approximately 1 mW to 1 watt being advantageously supplied to the plasma regions via the microwave generator and the launching structure.

The supplied gas is preferably an inert gas, in particular argon, He or Xe, as well as air, nitrogen, hydrogen, acetylene or methane, that is preferably supplied with a gas flow of about 10 scam to about 1000 scam (standard cubic centimeters per minute). However, in the individual case, these parameters are scaled by the selected dimensional size of the device for producing plasma and are merely to be considered as typical values. Another significant benefit is that the device in accordance with the present invention can be operated while exposed to air, thereby achieving an oxidic surface excitation. Moreover, the broad pressure range within which the work can be done, from atmospheric pressure down to a precision vacuum, makes possible many diverse applications.

The device in accordance with the present invention and the method implemented therewith are especially suited for processing or activating the surfaces of a substrate or for depositing layers. Its special advantage lies, in this context, in the spatially narrowly limited extent of the plasma regions and in their immediate vicinity to the substrate surface to be treated.

DETAILED DESCRIPTION

Figure 1:
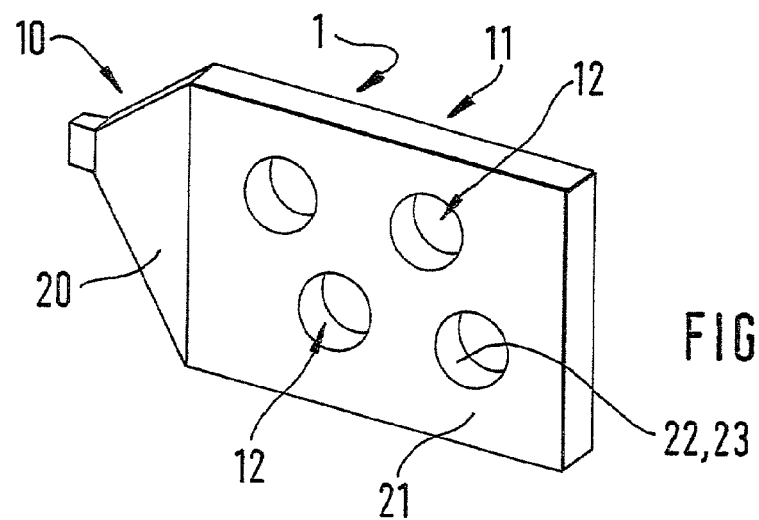
FIG. 1 depicts a device including a guide structure having cylindrical holes.

FIG. 1 illustrates a device 1 having a launching structure 10, a guide structure 11, and plama regions 12. In this case, launching structure 10 has the shape of a horn 20, as is generally known from microwave technology, and is used for launching microwaves into guide structure 11. The microwaves are generated by a generally known microwave generator (not shown) which is linked to launching structure 10. Horn 20 passes electroconductively over into guide structure 11, enabling microwaves to be launched by microwave generator via launching structure 10 into guide structure 11.

In this example, guide structure 11 is designed as waveguide 21 of a metal, such as copper, high-grade steel, gold or silver, which is filled on the inside, for example, with silicon dioxide as rigid, puncture-proof, low-loss dielectric material 22. Waveguide 21 has a thickness of up to a few mm. Its length is variable, but should amount to one fourth of the wavelength of the injected microwaves. Its width is determined in accordance with the waveguide mode selected.

In addition, waveguide 21 is provided with a multiplicity of cylindrical holes 26, which are configured in a regular arrangement and which define plasma regions 12 located in the vicinity of cylindrical hole 26. The diameter of individual cylindrical hole 26 amounts to about 50 µm to 1 mm. Thus, device 1 is a microstructure, a plasma being ignited within each plasma region 12 of guide structure 11 subsequent to the supplying of a gas. Inner wall 23 of cylindrical holes 26 and, optionally, the entire electrode surfaces of guide structure 11 are also provided with a dielectric, in particular a ceramic, coating as a protective layer, which is made, for example, of aluminum oxide or silicon dioxide.

The frequency of the microwaves launched into guide structure 11 is expediently between 300 MHz to 30 GHz; preferably between 900 MHz and 2.45 GHz are used. In this context, waveguide 21 is preferably dimensionally sized, and the frquency of the microwaves is preferably selected such that the $H_{10}$ mode of the launched microwaves is excited in waveguide 21 and propagates.

For this, in the individual case, one skilled in the art must match the width of waveguide 21 and the frequency of the microwaves to one another. For excitation of the $H_{10}$ mode, merely the width of waveguide 21 is a critical quantity, while it length, for example, is merely relevant to the attenuation of the propagating microwave. The power of the launched microwaves is additionally selected to yield a power of about 1 mW to about 1 watt for each plasma discharge region 12.

Figure 3:
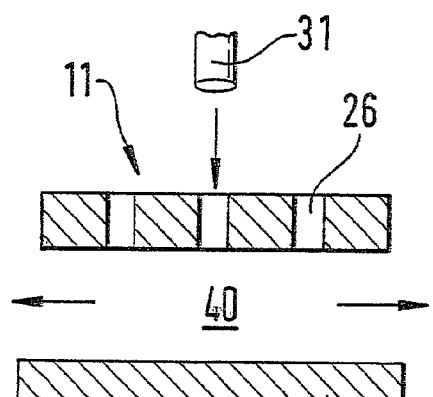
FIG. 3 depicts a first gas guideway in the case of a plasma processing of a substrate using a guide structure.
Figure 4:
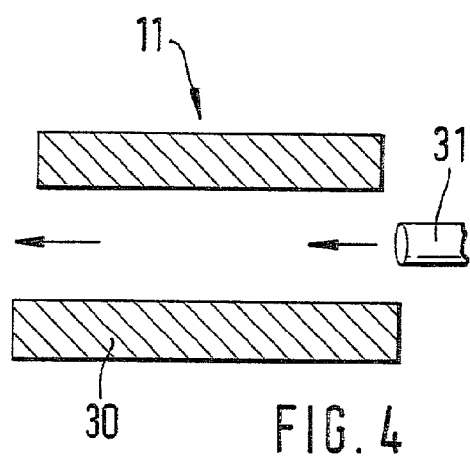
FIG. 4 depicts an alternative specific embodiment including another gas guideway.

FIGS. 3 and 4 elucidate the operation of device 1 for treating the surface of a substrate 30 with a plasma through the microstructure electrode discharges produced using device 1 in plasma regions 12 of guide structure 11. To this end, in accordance with FIG. 3, a gas is directed via a gas supply line 31 from the side facing away from substrate 30 through cylindrical holes 26 of guide structure 11. Thus, this gas flows past the surface of substrate 30 and then off to the side. As of a minimal injected microwave power, which is essentially a function of the type of supplied gas, the gas flow, the pressure, and the thickness of waveguide 21, plasma is then generated in plasma regions 12 essentially defined by the dimensions of cylindrical hole 26. Thus, located between guide structure 11 and substrate 30, at least on a region by region basis, is a plasma volume 40, formed by various plasma regions 12, which are isolated from one another or which merge, depending on the spacing between cylindrical holes 26.

The supplied gas is, for example, an inert gas, respectively a noble inert gas, such as nitrogen or argon, for cleaning or activating the surfaces of substrate 30. However, in the same way, it can also be a generally known reactive gas, such as oxygen, air, acetylene, hydrogen, or a gaseous or vaporous precursor material, such as an organic silicon or organic titanium compound. Depending on the selection of the supplied gas, chemical reactions can also be induced by device 1 at the surface of the substrate, or a surface coating can be provided, for example in the form of a hard material coating or wear-protection layer.

The plasma is produced in plasma region 12 with the aid of microwaves launched into guide structure 11 and with the supplying of a gas, and depends on the dimensional design of guide structure 11, the type of supplied gas, the diameter of cylindrical holes 26, the width of waveguide 21, and the desired treatment of the surface at a pressure of about 0.01 mbar up to about 1 bar. Each variable is to be determined in the individual case by one skilled in the art based on simple preliminary tests. A preferred pressure is from 10 mbar up to 200 mbar, with plasma gas being supplied with a typical gas flow of a few sccm up to about 1000 sccm. However, this value is likewise to be adapted by one skilled in the art to the particular process parameters for each case, after performing preliminary tests.

As a second exemplary embodiment, FIG. 4 depicts an alternative routing of the supplied gas via gas supply line 31. In this context, the gas flows past, in between the surface of substrate 30 and guide structure 11, and is not fed through cylindrical holes 26. Apart from that, however, the parameters for producing the plasma in plasma regions 12 are completely analogous to the exemplary embodiment elucidated with the aid of FIGS. 1 and 3.

In a third exemplary embodiment, as a slight variation of waveguide 21, guide structure 11 is made of two parallel spaced metal plates, whose interstitial space is filled with silicon dioxide. Apart from that, guide structure 21 is constructed substantially similar to the first examplary embodiment and FIG. 1, especially with respect to dimensional design, cylindrical holes, and material. The advantage of using two parallel metal plates in place of waveguide 21 is that, from a standpoint of production engineering, they are simpler and less expensive to fabricate than a closed, integrated, waveguide 21. In this case, the guidance and propagation of the launched microwaves is carried out by way of a capacitive coupling of the two plates. Analogously to the preceding exemplary embodiments, the gas is supplied in this exemplary embodiment in the manner explained with respect to FIG. 3 or 4.

Figure 2:
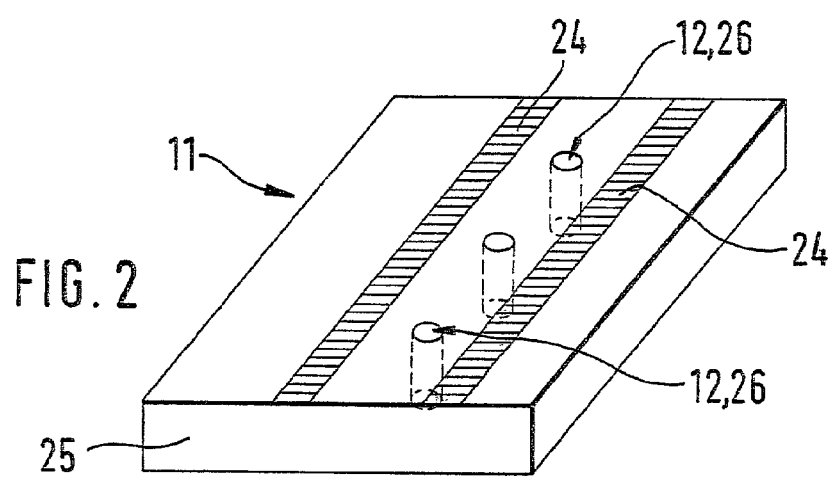
FIG. 2 depicts an alternative specific embodiment of the guide structure.

As a further exemplary embodiment, FIG. 2 clarifies an alternative specific embodiment of guide structure 11, the launched microwaves being guided via strip lines 24 using microstrip technology. In this case, horn 20 is not necessary since the microwaves generated by the microwave generator are injected via coaxial plug connectors (not shown).

In detail, in this example at least two, but preferably a multiplicity of, metallic strip lines 24 are applied to a dielectric plate 25, which is made of a puncture-proof, rigid dielectric material, such as silicon dioxide. These strip lines 24 expediently run in parallel to one another at a distance that is a function of the frequency and the dielectric material used, and are preferably made of copper or gold, which is optionally applied to a galvanic reinforcement, such as nickel. The optimal spacing of strip lines 24 for igniting and sustaining a plasma in plasma regions 12 is additionally a function of the type of gas supplied and of the prevailing pressure and must, therefore, be determined in simple preliminary tests.

Furthermore, analogously to FIG. 1, cylindrical holes 26 are provided in dielectric plate 25 between strip lines 24. With respect to the dimensional design of guide structure 11 and of cylindrical holes 26, reference is made to the preceding explanations regarding the first exemplary embodiment. In particular, in this case as well, cylindrical bores 26 can be provided with a dielectric coating, for example in the form of a ceramic protective layer, on inner wall 23. Cylindrical bores 26, in turn, define locally limited plasma regions 12, in which microstructure electrode discharges are ignited via the injected microwaves directed via strip lines 24 in response to the supplying of a gas or on exposure to air. When cylindrical holes 26 are arranged in a dense enough configuration, the plasmas produced in plasma regions 12 merge, and a laterally homogeneous plasma develops.

In the case of a guide structure 11 in accordance with FIG. 2, the gas guidance is completely analogous to the exemplary embodiments already explained and can be carried out in the manner explained with respect to FIG. 3 or 4, in that the gas is directed through cylindrical holes 26 or conveyed between substrate 30 and guide structure 11.

REFERENCE SYMBOL LIST 1 device
10 launching structure
11 guide structure
12 plasma region
20 horn
21 waveguide
22 dielectric material
23 inner wall
24 strip line
25 dielectric plate
26 cylindrical hole
30 substrate
31 gas supply line
40 plasma volumes

The invention claimed is:

1. A device for producing a plasma through microstructure electrode discharges, a use of the plasma including at least one of treating surfaces, chemically reacting gases, and producing light, the device comprising:
   at least one guide structure, the at least one guide structure including at least one hole, wherein a plasma region includes at least one of the hole and an area adjacent to the hole;
   a microwave generator, the microwave generator launching electromagnetic microwaves into the at least one guide structure to produce the plasma, the plasma being produced in the plasma region, wherein the at least one guide structure is a metallic waveguide filled with a dielectric material, the dielectric including at least one of silicon dioxide, ceramic, and Kapton; and further comprising:
   an arrangement of at least two spaced metal plates, the at least two spaced metal plates forming an interstitial space filled with a dielectric material.

2. The device of claim 1, wherein the metallic waveguide has a thickness.

3. The device of claim 1, wherein an $H_{10}$ mode of the microwaves is launched into the at least one guide structure.

4. A device for producing a plasma through microstructure electrode discharges, a use of the plasma including at least one of treating surfaces, chemically reacting gases, and producing light, the device comprising:
- at least one guide structure, the at least one guide structure including at least one hole, wherein a plasma region includes at least one of the hole and an area adjacent to the hole; and
- a microwave generator, the microwave generator launching electromagnetic microwaves into the at least one guide structure to produce the plasma, the plasma being produced in the plasma region, wherein the at least one guide structure is an arrangement of at least two spaced metal plates, the at least two spaced metal plates forming an interstitial space filled with a dielectric material.

5. The device of claim 4, wherein the metal plates have a spacing of 10 mm to 1000 mm.

6. A device for producing a plasma through microstructure electrode discharges, a use of the plasma including at least one of treating surfaces, chemically reacting gases, and producing light, the device comprising:
- at least one guide structure, the at least one guide structure including at least one hole, wherein a plasma region includes at least one of the hole and an area adjacent to the hole; and
- a microwave generator, the microwave generator launching electromagnetic microwaves into the at least one guide structure to produce the plasma, the plasma being produced in the plasma region, wherein the at least one guide structure is an arrangement of at least two metallic strip lines, the at least two metallic strip lines running on a dielectric plate.

7. A device for producing a plasma through microstructure electrode discharges, a use of the plasma including at least one of treating surfaces, chemically reacting gases, and producing light, the device comprising:
- at least one guide structure, the at least one guide structure including at least one hole, wherein a plasma region includes at least one of the hole and an area adjacent to the hole; and
- a microwave generator, the microwave generator launching electromagnetic microwaves into the at least one guide structure to produce the plasma, the plasma being produced in the plasma region, wherein the at least one guide structure is at least one of planar, curved, cylindrical and coaxial, the at least one guide structure including an internal, central conductor.

* * * * *